United States Patent
Jui-Yuan et al.

(10) Patent No.: US 6,407,920 B1
(45) Date of Patent: Jun. 18, 2002

(54) HEAT-DISSIPATING ASSEMBLY AND PROCESS FOR ASSEMBLING THE SAME

(75) Inventors: Hsu Jui-Yuan; Chen Yu Timothy Yu, both of Taoyuan (TW)

(73) Assignee: Delta Electronics, Inc., Taoyuan Shien (TW)

( * ) Notice: Subject to any disclaimer, the term of this patent is extended or adjusted under 35 U.S.C. 154(b) by 0 days.

(21) Appl. No.: 09/918,114

(22) Filed: Jul. 30, 2001

(51) Int. Cl.⁷ .................................................. H05K 7/20
(52) U.S. Cl. ...................... 361/697; 165/80.3; 165/122; 165/185; 257/718; 257/722; 257/719; 361/704
(58) Field of Search ...................... 165/80.3, 121–122, 165/126; 174/16.3; 257/718–719, 722; 361/687, 694–697, 704, 707, 710; 415/176–178, 213.1, 214.1; 454/184

(56) References Cited

U.S. PATENT DOCUMENTS

| | | | |
|---|---|---|---|
| 5,287,249 A | * 2/1994 | Chen | 165/80.3 |
| 5,828,551 A | * 10/1998 | Hoshino et al. | 361/697 |
| 6,269,864 B1 | * 8/2001 | Kabadi | 165/80.3 |
| 6,343,013 B1 | * 1/2002 | Chen | 361/695 |
| 6,352,103 B1 | * 3/2002 | Chu et al. | 165/80.3 |

\* cited by examiner

*Primary Examiner*—Gregory Thompson
(74) *Attorney, Agent, or Firm*—Alston & Bird LLP

(57) ABSTRACT

A heat-dissipating assembly for removing a portion of heat from a heat-generating device includes a fan and a heat sink. The fan has holes. The heat sink has a base in contact with a surface of the heat-generating device, and first fins and second fins extending upwards from the base, wherein the second fins further have projecting plates corresponding to the holes and each of the projecting plates includes a pedestal and a fastening portion, the height of the pedestal being substantially the same as that of the fan, wherein the projecting plates are inserted into the corresponding holes and the fasting portions are bent so as to be in contact with the upper surface of the fan.

11 Claims, 4 Drawing Sheets

HEAT-DISSIPATING ASSEMBLY AND PROCESS FOR ASSEMBLING THE SAME

FIELD OF THE INVENTION

The present invention relates to a heat-dissipating assembly. The present invention also relates to a process for assembling the same.

BACKGROUND OF THE INVENTION

An integrated circuit chip is widely used in an electrical appliance such as a computer. When the electrical appliance operates, the chip generates energy in the form of heat. If the chip is unable to transfer enough heat to ambient air, the elevated operating temperature may result in damage of the chip or breakdown of the whole appliance. In order to remove most heat generated from the chip, especially a CPU (central processing unit), an additional heat sink is usually attached on and spreads over the top surface thereof. The heat sink is made of a highly thermal conductive material and has a larger surface area than the attached CPU for improving heat transfer. In addition, the heat sink is frequently constructed with spaced fins in order to provide extra surface area. Furthermore, heat can be quickly dissipated by improving the efficiency of the air circulation when a fan is disposed on the heat sink.

FIG. 1 is an exploded view showing a typical heat-dissipating assembly for a CPU 11. The heat-dissipating assembly includes a heat sink 12 and a fan 13. The heat sink 12 is made of a highly conductive material, for example aluminum. The heat sink 12 includes a base 120 and a plurality of sheet-shaped fins 121. The base 120 is in contact with the top surface of the CPU chip 11. The fan 13 is disposed on the heat sink 12.

The heat sink 12 is mounted by edge plates 123 on two sides thereof. The edge plates 123 are bent to form sheltering plates 124. The sheltering plates 124 have openings 125 corresponding to holes 131 of the fan 13. The fan 13 is coupled with heat sink 12 by passing screws 16 through the holes 131 and then engaging the screws 16 with the openings 125.

It is found that the process for coupling the heat sink 12 with the fan 13 has the following disadvantages:

(1) The procedures of mounting the edge plates 123 onto the heat sink 12, bend the edge plates 123 to form sheltering plates 124 and drilling opening 125 are labor-intensive and time-consuming.

(2) Since four screws 16 and two edge plates 123 are required, the material cost is high.

(3) The screws 16 are engaged with the opening 125 one by one, which is also time-consuming.

Therefore, the present invention provides an improved heat-dissipating assembly and a process for assembling the same so as to overcome the problems described above.

SUMMARY OF THE INVENTION

It is an object of the present invention to provide a heat-dissipating assembly for reducing assembling time.

It is another object of the present invention to provide a heat-dissipating assembly for reducing material cost.

In accordance with an aspect of the present invention, there is provided a heat-dissipating assembly for removing a portion of heat from a heat-generating device. The heat-dissipating assembly includes a fan and a heat sink. The fan has holes. The heat sink has a base in contact with a surface of the heat-generating device, and first fins and second fins extending upwards from the base, wherein the second fins further have projecting plates corresponding to the holes, each of the projecting plates includes a pedestal and a fastening portion, and the height of the pedestal is substantially the same as that of the fan, wherein the projecting plates are inserted into the corresponding holes and the fasting portions are bent so as to be in contact with the upper surface of the fan.

Preferably, the heat-generating device is an electronic device in operation.

Preferably, the electronic device is a CPU (central processing unit).

Preferably, the projecting plates are integrally formed with the second fins.

Preferably, two notches are formed between the pedestal and the fastening portion.

Preferably, the maximum cross-sectional length of the pedestal is slightly smaller than the diameter of the hole.

In accordance with another aspect of the present invention, there is provided a heat-dissipating assembly for removing a portion of heat from a CPU (central processing unit). The heat-dissipating assembly includes a fan having holes and a heat sink having a base in contact with a surface of the CPU and first fins and second fins extending upwards from the base, wherein the second fins further have projecting plates corresponding to the holes, each of the projecting plates includes a pedestal and a fastening portion, two notches are formed between the pedestal and the fastening portion, and the height of the pedestal is substantially the same as that of the fan, wherein the projecting plates are inserted into the corresponding holes and the fasting portions are bent so as to be in contact with the upper surface of the fan.

Preferably, the projecting plates are integrally formed with the second fins.

In accordance with another aspect of the present invention, there is provided a process for assembling a heat-dissipating assembly. The process includes steps of (a) providing a fan having holes and a heat sink, wherein the heat sink has first fins and second fins, the second fins have projecting plates corresponding to the holes and each of the projecting plates includes a pedestal and a fastening portion; (b) allowing the projecting plates to be inserted into the corresponding holes, thereby protruding the fastening portions through the holes; and (c) bending the fastening portions to be in contact with the upper surface of the fan.

Preferably, the projecting plates are integrally formed with the second fins.

Preferably, two notches are formed between the pedestal and the fastening portion.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
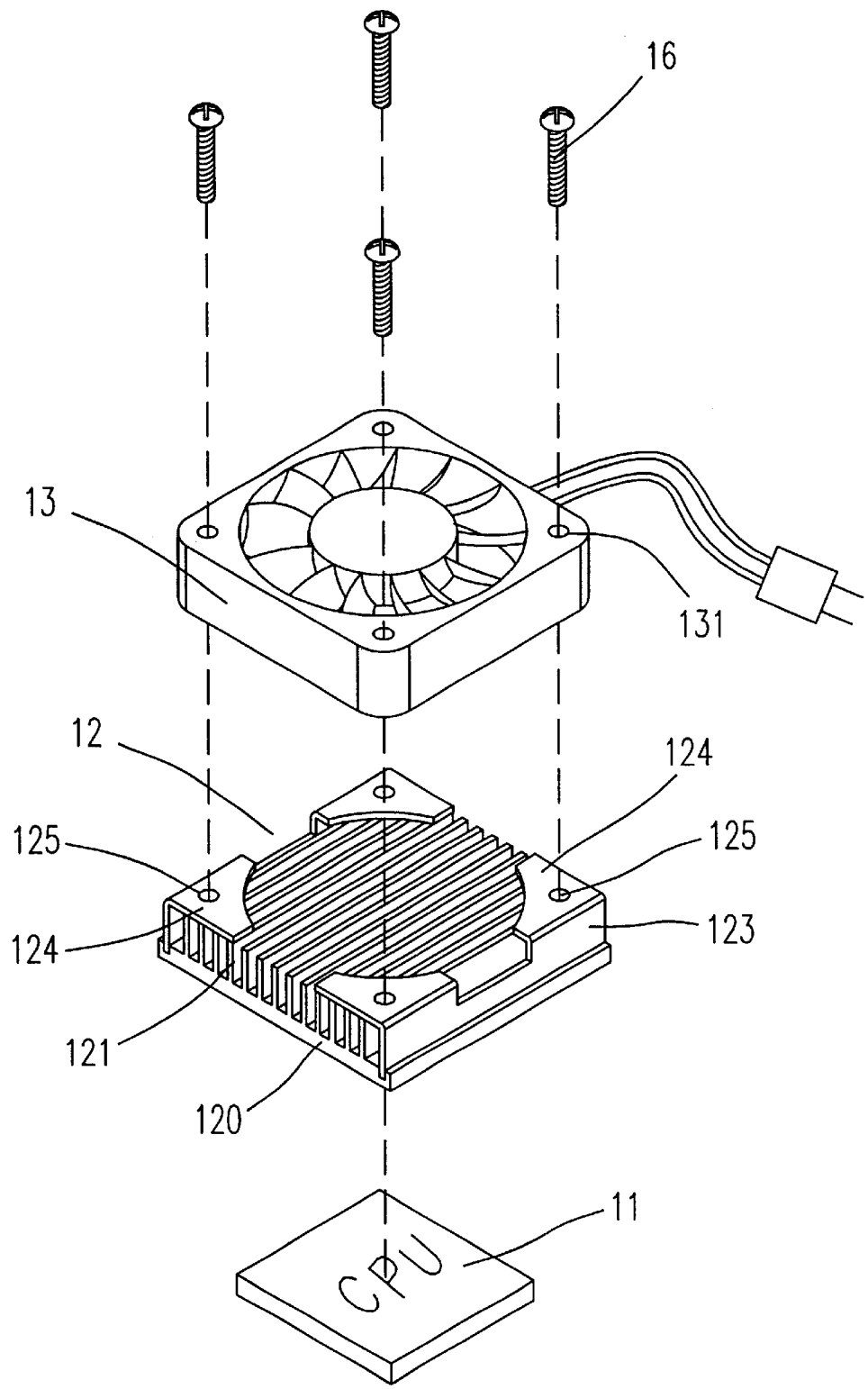
FIG. 1 is an exploded view showing a heat-dissipating assembly for a CPU in the prior art.
Figure 2A:
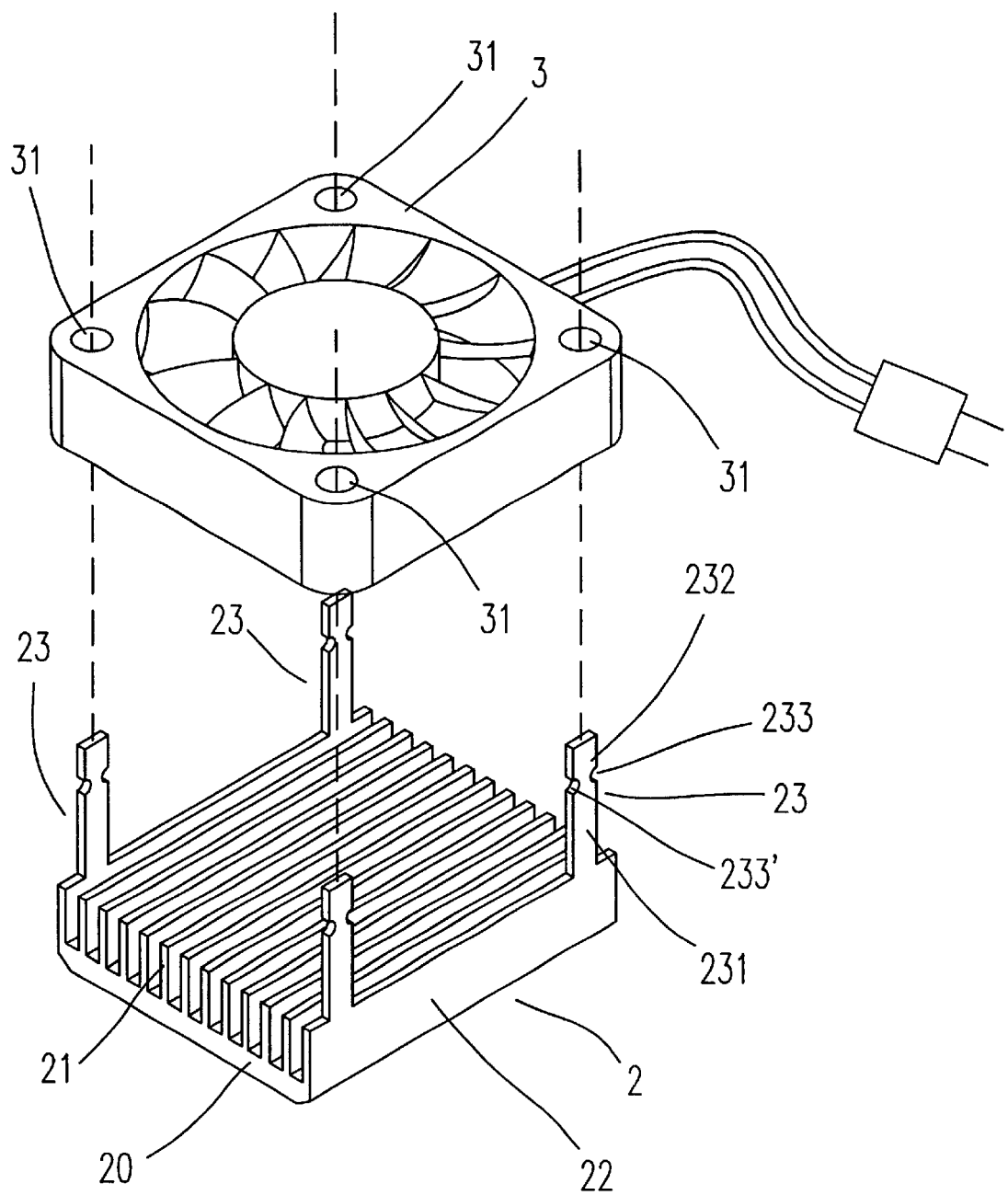
FIGS. 2(a), (b) and (c) are views illustrating the steps for assembling the heat-dissipating assembly according to a preferred embodiment of the present invention.

FIGS. 2(a), (b) and (c) are views illustrating the steps for assembling the heat-dissipating assembly according a preferred embodiment of the present invention. The heat-dissipating assembly includes a heat sink 2 and a fan 3. The fan 3 has four holes 31.

The heat sink 2 is made of a highly conductive material, for example aluminum. The heat sink 2 includes a base 20 in contact with a surface of a heat-generating device, for example a CPU chip (not shown), and fins 21 and 22 extending upwards from the base 20. The fins 21 are sheet-shaped and used for increasing heat transfer surface area. The fins 22 further have projecting plates 23 corresponding to the holes 31. Preferably, the projecting plates 23 are integrally formed with the fins 22. Each of the projecting plates 23 includes a pedestal 231 and a fastening portion 232. In this embodiment, two notches 233, 233' are formed between the pedestal 231 and the fastening portion 232. The height of the pedestal 231 is substantially the same as that of the fan 3. The maximum cross-sectional length of the pedestal 231 is slightly smaller than the diameter of the hole 31.

Figure 2B:
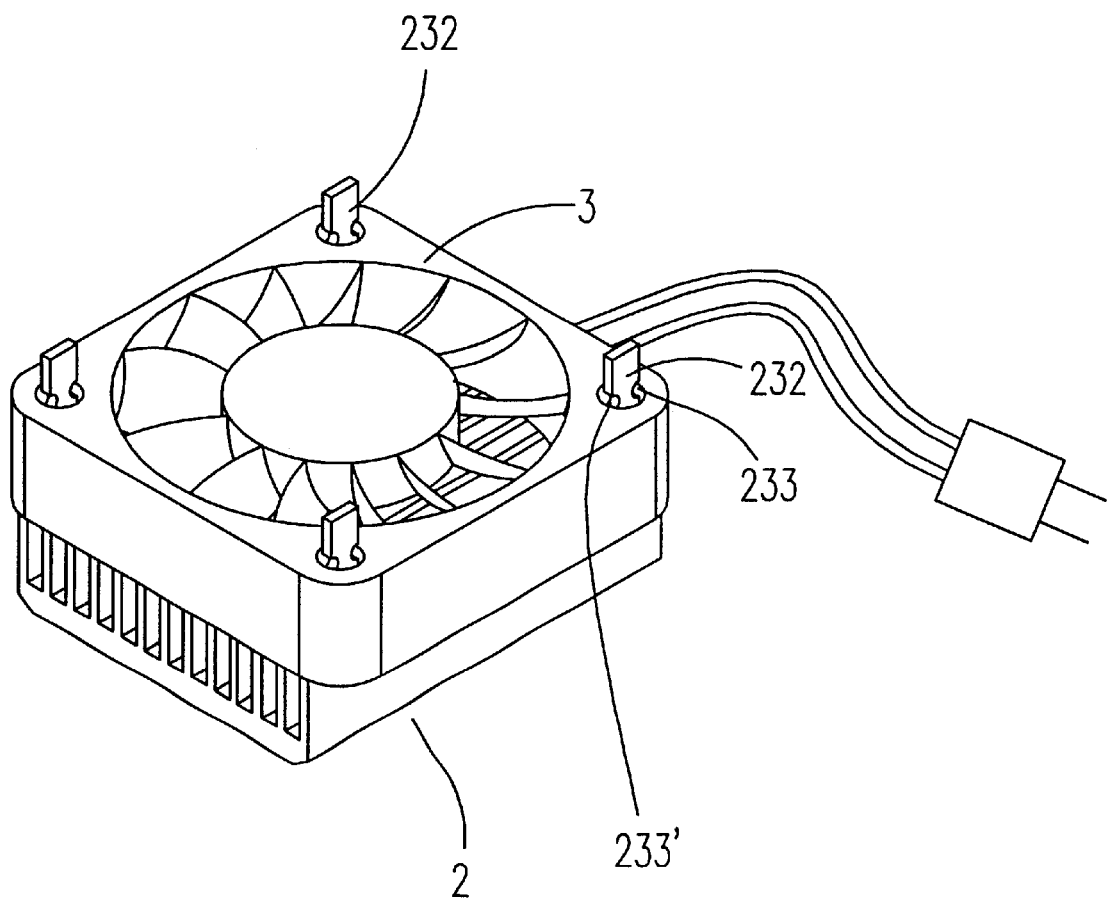
Figure 2C:
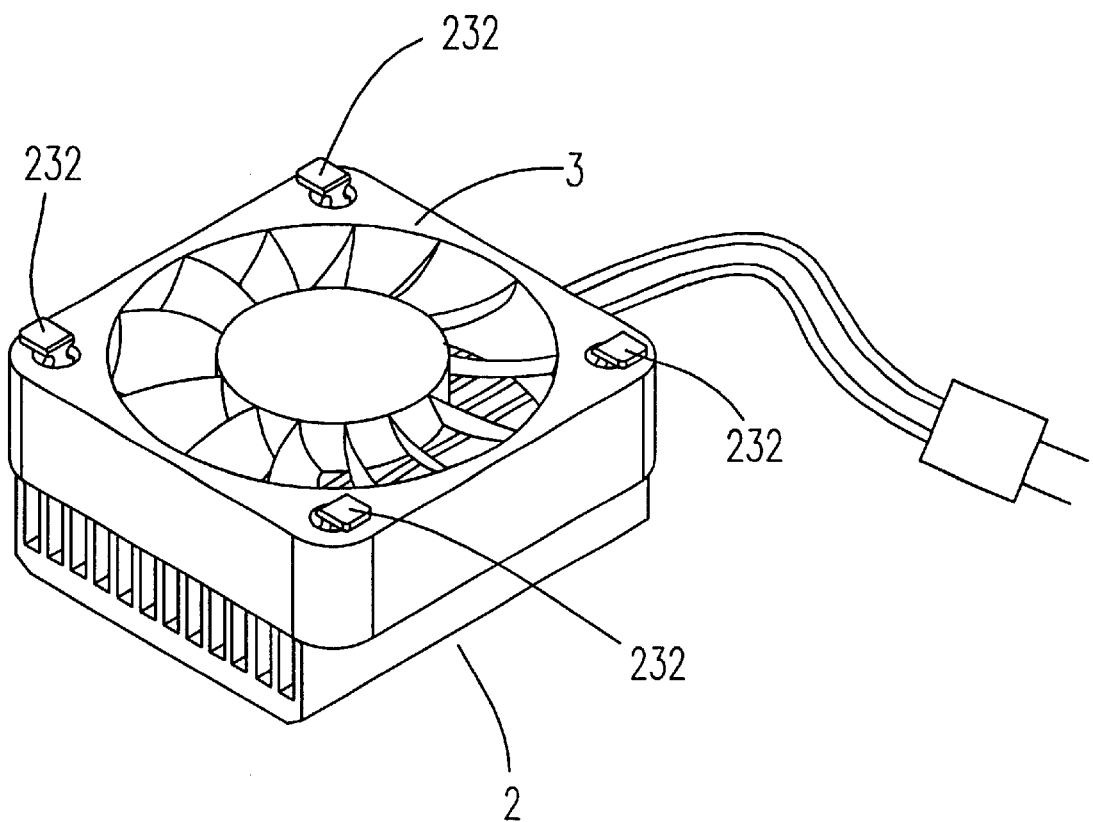

For assembling the heat-dissipating assembly according to the present invention, the fan 3 is first put on the heat sink 2 by allowing the projecting plates 23 to be inserted into the corresponding holes 31 so as to protrude the fastening portions 232 through the holes 31, as can be seen in FIGS. 2(*a*) and 2(*b*). Referring to FIG. 2(*c*), the fastening portions 232 are bent at about 90 degrees to be in contact with the upper surface of the fan 3.

Because the height of the pedestal 231 is substantially the same as that of the fan 3, the fastening portions 232 protrude through the holes 31 for being further bent when the projecting plates 23 are inserted into the holes. The two notches 233, 233' are suitable for facilitating bending the fastening portions 232. The bent fastening portions 232 can prevent the fan 13 from moving vertically. Since the maximum cross-sectional length of the pedestal 231 is slightly smaller than the diameter of the hole 31, the pedestal 231 can prevent the fan 13 from moving horizontally. Therefore, the fan 13 is securely coupled with the heat sink 2.

As will be apparent from the above description according to the present invention, the heat-dissipating assembly has the following advantages:

1. Since the projecting plates 23 and the heat sink 2 are integrally formed for the heat-dissipating assembly of the present invention, the cost thereof is less than that in the prior art.

2. For assembling the heat sink 12 and the fan 13 in the prior art, edge plates 123 and four screws 125 are required. It is known that the elements for assembling the heat-dissipating assembly of the present invention are less.

3. The fastening portions 232 of the present invention can be bent mechanically, thereby reducing the assembling time.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A heat-dissipating assembly for removing a portion of heat from a heat-generating device, comprising:

a fan having holes; and a heat sink having a base in contact with a surface of a heat-generating device, and first fins and second fins extending upwards from said base, wherein said second fins further have projecting plates corresponding to said holes, each of said projecting plates comprising a pedestal and a fastening portion, and the height of each said pedestal is substantially the same as that of said fan, wherein said projecting plates are inserted into said corresponding holes and said fastening portions are bent so as to be in contact with the upper surface of said fan.

2. The heat-dissipating assembly according to claim 1, wherein said heat-generating device is an electronic device in operation.

3. The heat-dissipating assembly according to claim 2, wherein said electronic device is a CPU (central processing unit).

4. The heat-dissipating assembly according to claim 1, wherein said projecting plates are integrally formed with said second fins.

5. The heat-dissipating assembly according to claim 1, wherein two notches are formed between each said pedestal and each said fastening portion.

6. The heat-dissipating assembly according to claim 1, wherein the maximum cross-sectional length of each said pedestal is slightly smaller than the diameter of each said hole.

7. A heat-dissipating assembly for removing a portion of heat from a CPU (central processing unit), comprising:

a fan having holes; and a heat sink having a base adapted tube in contact with a surface of a CPU and first fins and second fins extending upwards from said base, wherein said second fins further have projecting plates corresponding to said holes, each of said projecting plates comprises a pedestal and a fastening portion, two notches are formed between each said pedestal and each said fastening portion, and the height of each said pedestal is substantially the same as that of said fan, wherein said projecting plates are inserted into said corresponding holes and said fastening portions are bent so as to be in contact with the upper surface of said fan.

8. The heat-dissipating assembly according to claim 7, wherein said projecting plates are integrally formed with said second fins.

9. A process for assembling a heat-dissipating assembly, comprising steps of:

(a) providing a fan having holes and a heat sink, wherein said heat sink has first fins and second fins, said second fins have projecting plates corresponding to said holes and each of said projecting plates comprises a pedestal and a fastening portion;

(b) allowing said projecting plates to be inserted into said corresponding holes, thereby protruding said fastening portions through said holes; and (c) bending said fastening portions to be in contact with the upper surface of said fan.

10. The process according to claim 9, wherein said projecting plates are integrally formed with said second fins.

11. The process according to claim 9, wherein two notches are formed between each said pedestal and each said fastening portion.

* * * * *